(12) United States Patent
Jiang et al.

(10) Patent No.: US 7,859,320 B2
(45) Date of Patent: Dec. 28, 2010

(54) LEVEL SHIFTER AND LEVEL SHIFTING METHOD

(75) Inventors: Fan Jiang, Beijing (CN); Ni Fu, Beijing (CN)

(73) Assignee: Via Technologies, Inc., Taipei (TW)

( * ) Notice: Subject to any disclaimer, the term of this patent is extended or adjusted under 35 U.S.C. 154(b) by 27 days.

(21) Appl. No.: 12/359,107

(22) Filed: Jan. 23, 2009

(65) Prior Publication Data
US 2009/0231013 A1    Sep. 17, 2009

(30) Foreign Application Priority Data
Mar. 14, 2008 (CN) .......................... 2008 1 0084718
Mar. 14, 2008 (TW) ............................. 97109007 A

(51) Int. Cl.
*H03L 5/00* (2006.01)
(52) U.S. Cl. ...................................................... 327/333
(58) Field of Classification Search ........................ None
See application file for complete search history.

(56) References Cited

U.S. PATENT DOCUMENTS

| | | | | |
|---|---|---|---|---|
| 5,786,711 A | | 7/1998 | Choi | |
| 5,818,081 A | * | 10/1998 | Ohmi et al. ................. | 257/319 |
| 6,028,449 A | * | 2/2000 | Schmitt ........................ | 326/80 |
| 6,040,708 A | * | 3/2000 | Blake et al. .................. | 326/33 |
| 6,064,227 A | * | 5/2000 | Saito ............................ | 326/68 |
| 6,407,579 B1 | * | 6/2002 | Goswick ...................... | 326/81 |
| 6,946,893 B2 | * | 9/2005 | Hayashi et al. ............. | 327/333 |
| 7,199,639 B2 | * | 4/2007 | Kanno et al. ................ | 327/333 |
| 7,224,200 B2 | * | 5/2007 | Kida et al. ................... | 327/333 |
| 7,456,663 B2 | * | 11/2008 | Lim ........................... | 327/112 |
| 2002/0009013 A1 | | 1/2002 | Lee | |
| 2005/0270066 A1 | | 12/2005 | Kozawa | |
| 2006/0197579 A1 | * | 9/2006 | Kanno et al. ................ | 327/333 |
| 2007/0063759 A1 | * | 3/2007 | Kida et al. ................... | 327/333 |
| 2008/0036522 A1 | * | 2/2008 | Chung et al. ................ | 327/333 |
| 2008/0204077 A1 | * | 8/2008 | Huang ......................... | 326/80 |

* cited by examiner

*Primary Examiner*—Lincoln Donovan
*Assistant Examiner*—Khareem E Almo
(74) *Attorney, Agent, or Firm*—Kirton & McConkie; Evan R. Witt

(57) ABSTRACT

For automatic initialization of a level shifter, an input signal in respect of a first voltage source is converted into a substantially zero voltage signal in response to an initial voltage derived from voltages of a first voltage source and a second voltage source when the second voltage source is activated but the first voltage source has not been activated yet. Afterwards, when the first voltage source and the second voltage source are both activated, the input signal in respect of the first voltage source is shifted into the output signal in respect the second voltage source without cooperation of the initial voltage.

17 Claims, 6 Drawing Sheets

LEVEL SHIFTER AND LEVEL SHIFTING METHOD

CROSS REFERENCE TO RELATED PATENT APPLICATION

A co-pending U.S. patent application Ser. No. 12/031,051, entitled "LEVEL SHIFTER", was filed Feb. 14, 2008 and assigned to the same assignee as this patent application. The contents of the related patent application are incorporated herein for reference.

FIELD OF THE INVENTION

The present invention relates to a level shifter and a level shifting method, which exhibit an automatic initialization function particularly when a voltage source is not timely activated to provide a required voltage.

BACKGROUND OF THE INVENTION

A level shifter is commonly used in a circuitry for shifting voltage levels.

Please refer to FIG. 1, which is a functional block diagram illustrating a conventional level shifter 10. The level shifter 10 includes an input buffer 102, an output buffer 106 and a level adjusting unit 104. The input buffer 102 is biased between a first voltage source (VDD) and a ground source (GND) for receiving an input signal Vin so that the input signal Vin has a voltage level ranged between the voltage level of the first voltage source and the voltage level of the ground source. The output buffer 106 is biased between a second voltage source (VPP) and the ground source for outputting an output signal Vout so that the output signal Vout has a voltage level ranged between the voltage level of the second voltage source and the voltage level of the ground source (GND). The level adjusting unit 104 is electrically coupled between the input buffer 102 and the output buffer 106, and biased between the second voltage source and the ground source for shifting the voltage level of the input signal Vin, which is primarily ranged VDD~GND, so as to generate the output signal Vout with the desired level ranged VPP~GND, wherein VPP is greater than VDD. In brief, after the input buffer 102 receives and transmits the input signal Vin to the level adjusting unit 104, the voltage level of the input signal Vin is adjusted from a level ranged VDD~GND to a level ranged VPP~GND, which is then outputted by the output buffer 106 as the output signal Vout.

In the above-mentioned circuit system, the first voltage source and the second voltage source are independent from each other. Therefore, the first voltage source and the second voltage source could be actuated asynchronously. If the second voltage source has been actuated but the first voltage source has not yet, the input buffer 102 relying on the voltage level of the first voltage source for work cannot function normally. Meanwhile, the voltage at the output end of the input buffer 102 would be indefinite and thus adversely affect the operation of the downstream output buffer 106. Accordingly, the overall output of the level shifter 10 would become abnormal.

SUMMARY OF THE INVENTION

The present invention provides level shifting means exhibiting an automatic initialization function to avoid malfunction.

The present invention provides a level shifter for converting an input signal into an output signal. The level shifter comprises an input buffer coupled between a first voltage source and a ground source for receiving the input signal; an output buffer coupled to a second voltage source and the ground source for outputting the output signal; a level adjusting unit electrically coupled between the input buffer and the output buffer and coupled to the ground source and the second voltage source for shifting a voltage level of the input signal from the input buffer according to a voltage level of the second voltage source; an initial voltage generator electrically coupled to the level adjusting unit and coupled to the first voltage source and the second voltage source, the initial voltage generator being configured to provide an initial voltage for the level adjusting unit in response to activation of the second voltage source and non-activation of the first voltage source; and an isolation module electrically coupled to the input buffer and coupled to the first voltage source and the second voltage source, the isolation module being configured to block charges from the second voltage source from infusing into the input buffer in response to activation of the second voltage source is activated and non-activation of the first voltage source.

The present invention also provides a level shifter comprising an input buffer coupled between a first voltage source and a ground source for receiving an input signal; an output buffer coupled to a second voltage source having a voltage level higher than that of the first voltage source and the ground source for outputting an output signal; a level adjusting unit electrically coupled between the input buffer and the output buffer and coupled to the ground source and the second voltage source for shifting a voltage level of the input signal from the input buffer according to a voltage level of the second voltage source; a bias circuit coupled to the second voltage source for generating a bias voltage; an initial voltage generator electrically coupled to the level adjusting unit and coupled to the first voltage source and the bias circuit, the initial voltage generator being configured to provide an initial voltage for the level adjusting unit in response to activation of the second voltage source is activated and non-activation of the first voltage source; and an isolation module electrically coupled to the input buffer and coupled to the first voltage source and the bias voltage, the isolation module being configured to block charges from the second voltage source from infusing into the input buffer in response to activation of the second voltage source and non-activation of the first voltage source.

The present invention further provides a level shifting method. The method comprises converting an input signal in respect of a first voltage source into an output signal in respect of a second voltage source in response to an initial voltage derived from a second voltage source in the event that the second voltage source is activated and the first voltage source has not been activated yet; and shifting the input signal in respect of the first voltage source into the output signal in respect of the second voltage source without cooperation of the initial voltage in response to the voltages of the first voltage source and the second voltage source which are both activated. Further, an input buffer for providing the input signal in respect of the first voltage source is isolated from the second voltage source in response to activation of the second voltage source and non-activation of the first voltage source.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
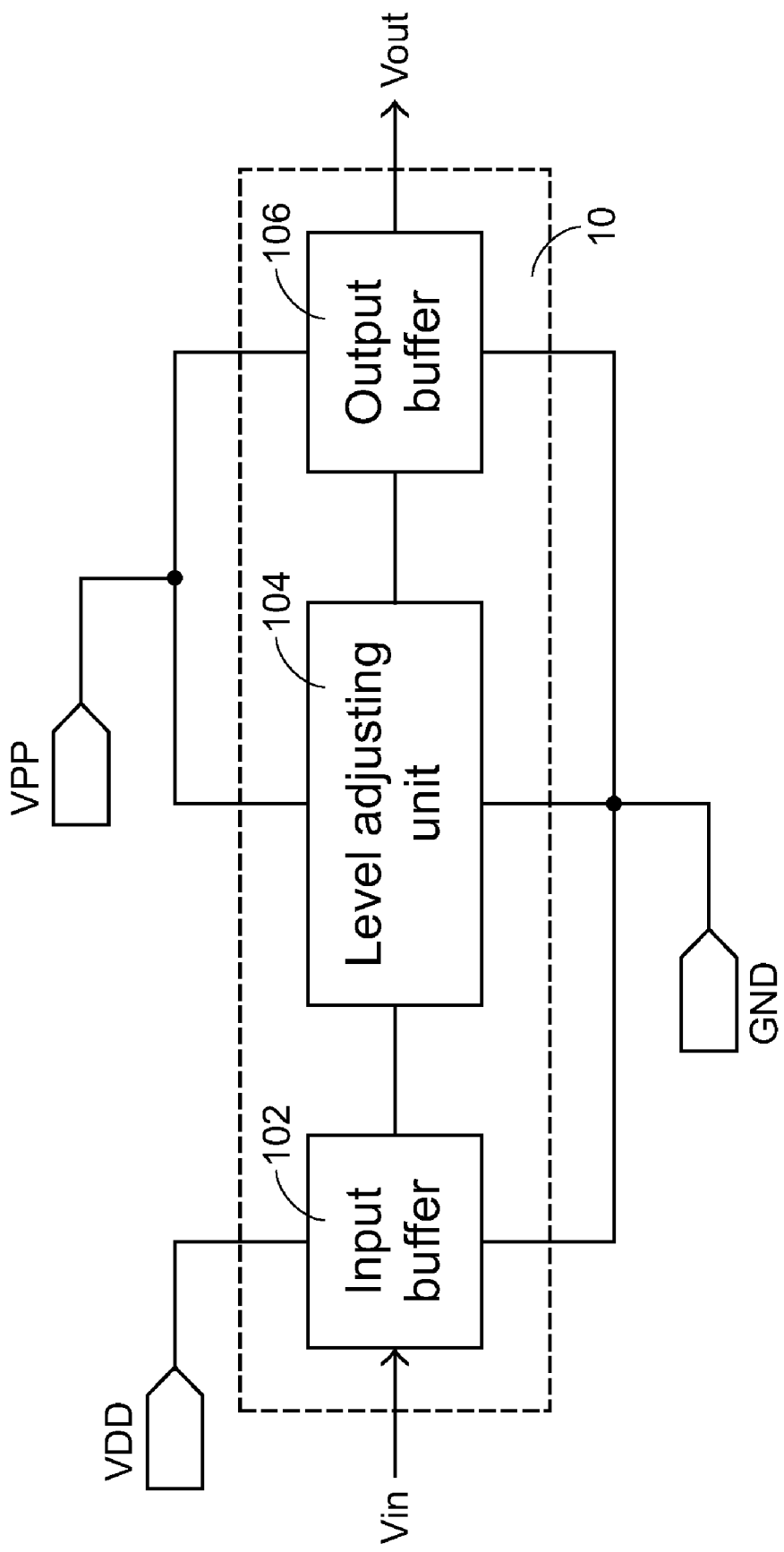
FIG. 1 is a functional block diagram illustrating a conventional level shifter.
Figure 2:
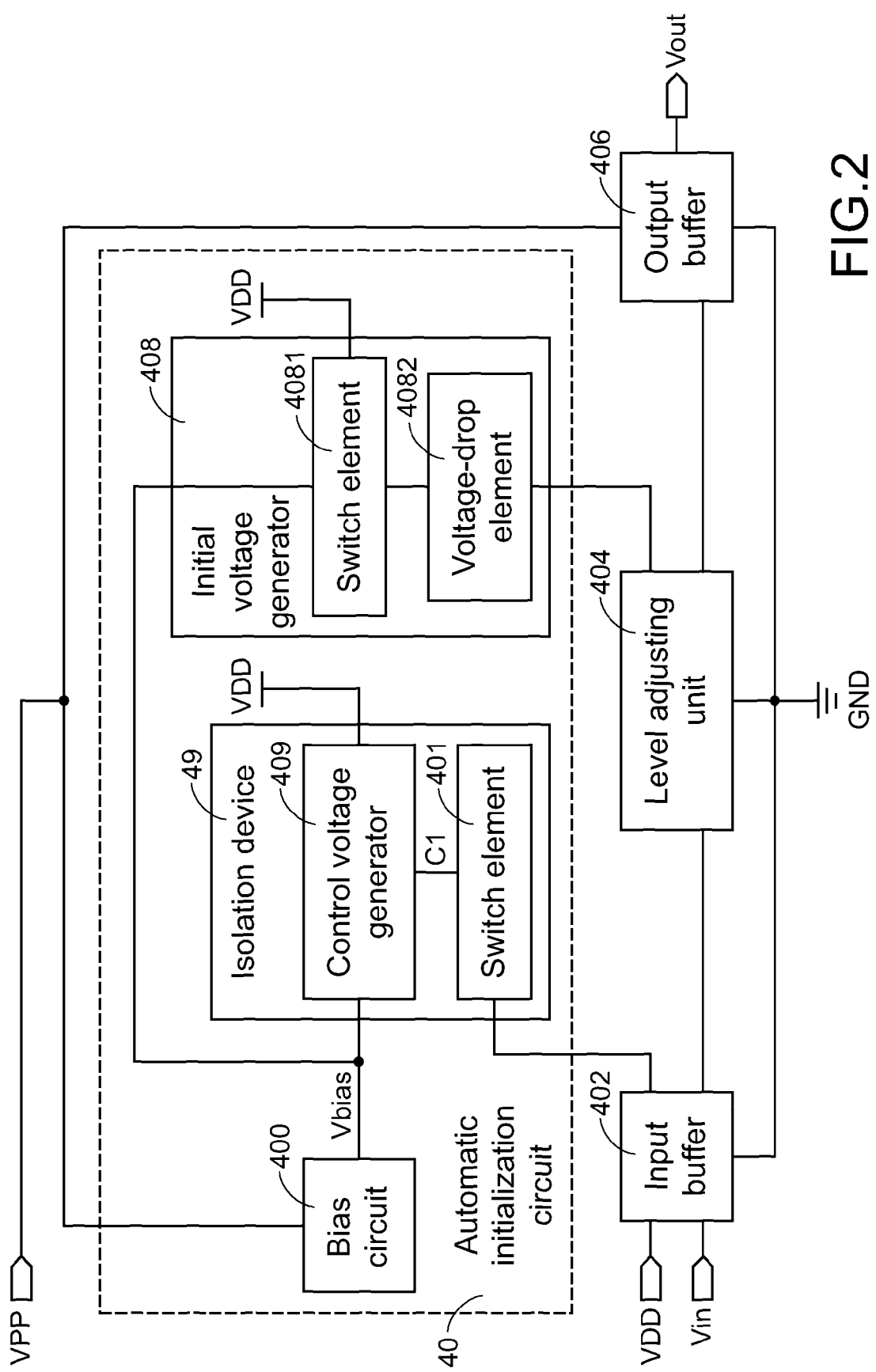
FIG. 2 is a functional block diagram illustrating a level shifter according to an embodiment of the present invention.

According to the present invention, a level shifter which allows automatic initialization (e.g. automatically start to output "0") and works normally within a wide voltage range is provided. An embodiment of the level shifter is illustrated in FIG. 2. The level shifter includes an input buffer 402, a level adjusting unit 404 and an output buffer 406. The input buffer 402 is biased between a first voltage source VDD and a ground source GND. The level adjusting unit 404 and output buffer 406 are both biased between a second voltage source VPP and the ground source GND. The second voltage source VPP has a higher voltage level than the first voltage source VDD. The level shifter further includes an automatic initialization circuit 40 for implementing automatic initialization. The automatic initialization circuit 40 consists of a bias circuit 400, an isolation device 49 and an initial voltage generator 408.

If the first voltage source VDD is timely turned on to provide a voltage required by the input buffer 402, the level shifter will work normally through the input buffer 402, the level adjusting unit 404 and the output buffer 406 without the aid of the initial voltage generator 408. That is, after the input buffer 402 receives and transmits the input signal Vin to the level adjusting unit 404, the voltage level of the input signal Vin is shifted from a level ranged VDD~GND to a level ranged VPP~GND, which is then outputted by the output buffer 406 as the output signal Vout. The above is referred to as a primary mode. On the other hand, once the first voltage source VDD is not timely turned on, an auxiliary mode is performed with the automatic initialization circuit 40.

In the automatic initialization circuit 40, the bias circuit 400 is designed under the bias by the second voltage source VPP in order to produce a bias voltage Vbias close to or slightly higher than the voltage level of the first voltage source VDD. The bias voltage Vbias is then utilized by the initial voltage generator 408 as well as the voltage from the first voltage source VDD to provide an initial voltage for the level adjusting unit 404. Since the initial voltage generator 408 functions to supply an initial voltage to the level adjusting unit 404 according to the bias voltage Vbias, possible malfunction of the level shifter resulting from an indefinite voltage at the output end of the input buffer 402 due to the inactive first voltage source VDD can be prevented.

In this embodiment, the initial voltage generator 408 includes a switch element 4081 and a voltage-drop element 4082 coupled to the switch element 4081 in series, and the isolation device 49 includes a control voltage generator 409 and another switch element 401. The switch element 4081 receives the bias voltage Vbias and the voltage from the first voltage source VDD, and is conducted to have the bias voltage Vbias pass through the voltage-drop element 4082 when the first voltage source VDD is inactive. Accordingly, the bias voltage Vbias is voltage-dropped and then enters the level adjusting unit 404. On the other hand, the control voltage generator 409 also receives the bias voltage Vbias and the voltage from the first voltage source VDD, and generates a control voltage C1 accordingly for controlling the on/off state of the switch element 401. When the first voltage source VDD is inactive, the switch element 401 is an OFF state to prevent charges from infusing into the input buffer 402 from the second voltage source VPP. Afterwards, when the first voltage source VDD has been activated, the switch element 4081 is cut off and the switch element 401 is conducted. Then the primary mode is performed, i.e. the initial voltage for the level adjusting unit 404 is from the input buffer 402.

Figure 3:
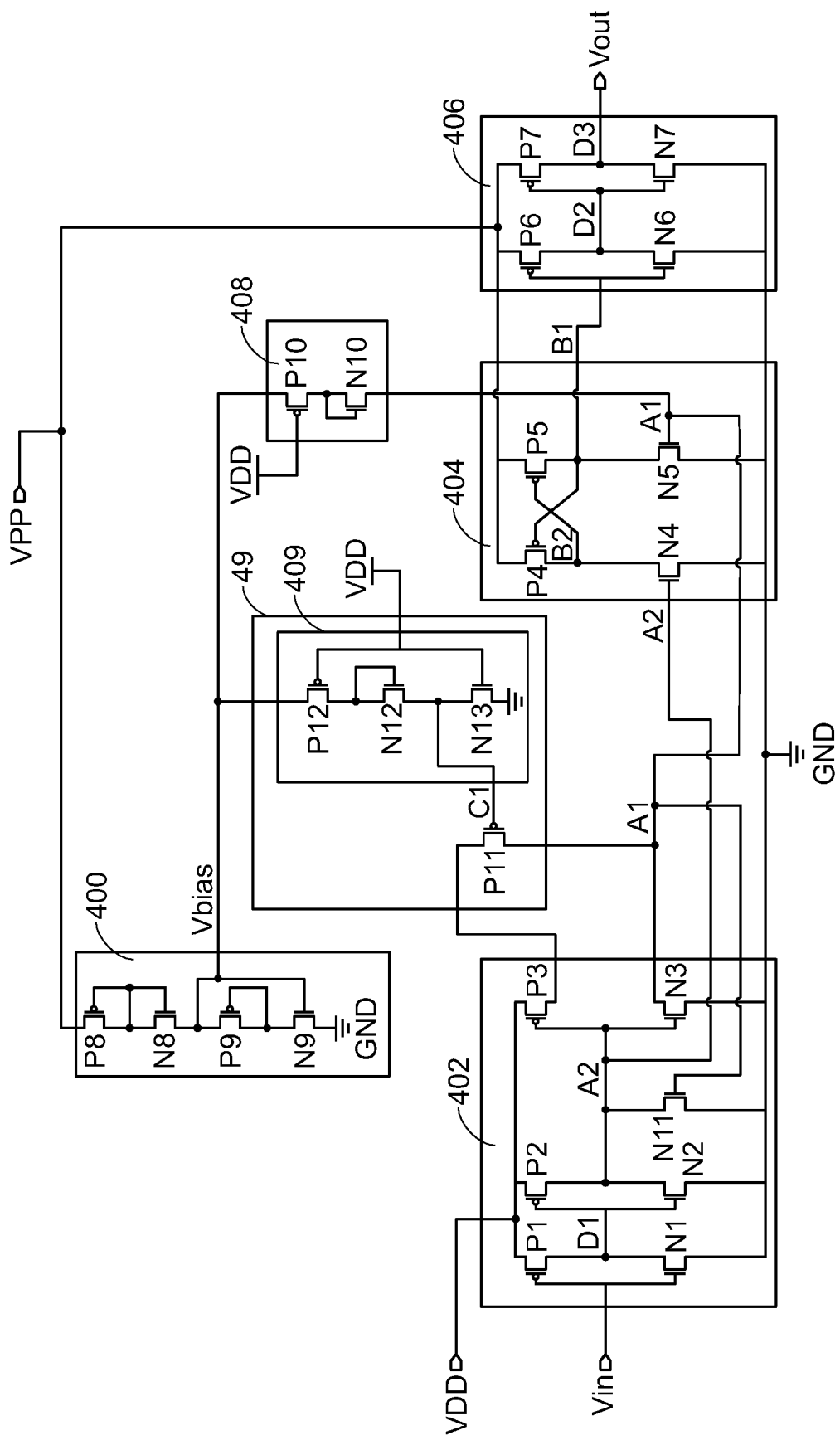
FIG. 3 is a circuit diagram schematically illustrating an example of the level shifter of FIG. 2.
Figure 4:
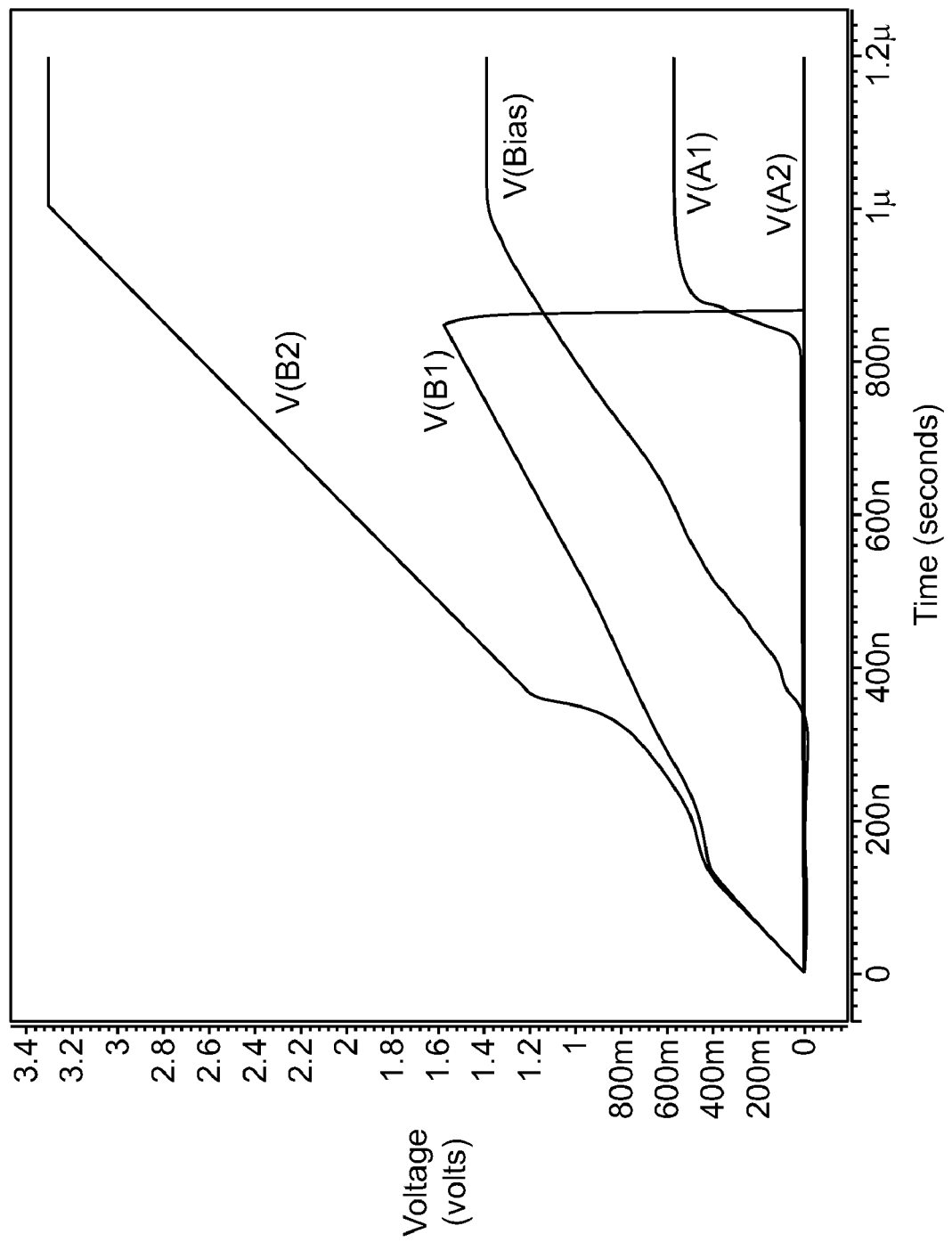
FIG. 4 is a voltage vs. current plot at a variety of nodes during the booting of VPP on the condition that VDD is absent.
Figure 5:
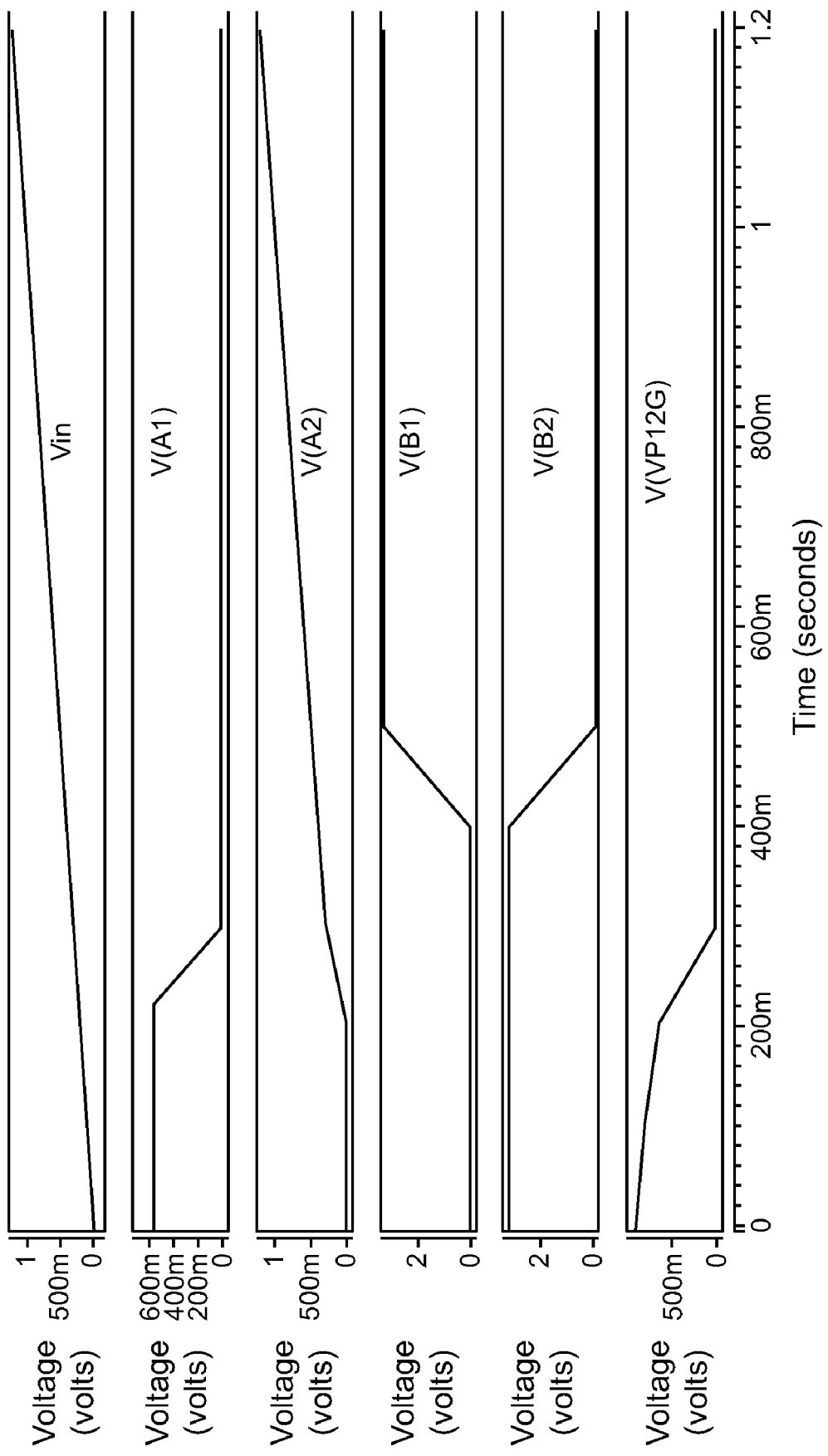
FIG. 5 is a voltage vs. current plot at a variety of nodes during the booting of VDD on the condition that VPP is being supplied.

FIG. 3 illustrates a circuitry example of the level shifter. As shown, the input buffer 402 is implemented with P-type transistors P1, P2 and P3, N-type transistors N1, N2, N3 and N11, wherein the sources of the P-type transistors P1, P2 and P3 are coupled to the first voltage source VDD; and the sources of the N-type transistors N1, N2, N3 and N11 are coupled to the ground source GND. The drains of the P-type transistors P1 and P2 are coupled to the drains of the N-type transistors N1 and N2 through nodes D1 and A2, respectively. The gates of the P-type transistor P1 and the N-type transistor N1 are coupled to the input signal Vin. The gates of the P-type transistor P2 and the N-type transistor N2 are coupled to the node D1. The gates of the P-type transistor P4 and the N-type transistor N4 are coupled to the node A2. The gate and drain of the N-type transistor N11 are coupled to nodes A1 and A2, respectively. The drain of the N-type transistor N3 is coupled to the node A1.

The level adjusting unit 404 is coupled to the input buffer 402 via the nodes A1 and A2, and implemented with P-type transistors P4 and P5 and N-type transistors N4 and N5. The sources of the P-type transistors P4 and P5 are coupled to the second voltage source VPP. The sources of the N-type transistors N4 and N5 are coupled to the ground source GND. The drains of the P-type transistors P4 and P5 are coupled to the drains of the N-type transistors N4 and N5 through nodes B2 and B1, respectively. The gate of the P-type transistor P4 is coupled to the node B1, and the gate of the P-type transistor P5 is coupled to the node B2. The gate of the N-type transistor N4 is coupled to the node A2, and the gate of the N-type transistor N5 is coupled to the node A1.

The output buffer 406 is coupled to the level adjusting unit 404 through the node B1, and implemented with P-type transistors P6 and P7, and N-type transistors N6 and N7, wherein the sources of the P-type transistors P6 and P7 are coupled to the second voltage source VPP; and the sources of the N-type transistors N6 and N7 are coupled to the ground source GND.

The drains of the P-type transistors P6 and P7 are coupled to the drains of the N-type transistors N6 and N7 through nodes D2 and D3, respectively. The gates of the P-type transistor P6 and the N-type transistor N6 are both coupled to the node B1. The gates of the P-type transistor P7 and the N-type transistor N7 are both coupled to the node D2. The voltage at the node D3 serves as the output Vout of the level shifter.

As shown in FIG. 3 and as described above, the bias circuit 400 implemented with the second voltage source VPP and the transistors P8/P9/N8/N9 is used for generating the bias voltage Vbias close to or slightly higher than the voltage level of the first voltage source VDD. The initial voltage generator 408 is implemented with a P-type transistor P10 and an N-type transistor N10, wherein the P-type transistor P10 functions as the switch element 4081 (FIG. 2), whose source receives the bias voltage Vbias, whose gate receives the voltage level from the first voltage source VDD, and whose drain is coupled to the drain of the N-type transistor N10; and wherein the N-type transistor N10 functions as the voltage-drop element 4082, whose drain and gate are coupled to each other so as to be equivalent to a diode, whose gate is coupled to the node A1 for charging the node A1. Accordingly, when the first voltage source VDD is at a high level, the switch element 4081 (i.e. the P-type transistor P10) is cut off; and the switch element 4081 (i.e. the P-type transistor P10) is switched on when the first voltage source VDD is at a zero level. Since the switching on/off states of the initial voltage generator 408 rely on the voltage level of the first voltage source VDD, the initial voltage can be optionally provided for automatic initialization.

Furthermore, the control voltage generator 409 of the isolation device 49 is implemented with a P-type transistor P12 and N-type transistors N12 and N13; and the switch element 401 of the isolation device 49 is implemented with a P-type transistor P11. The source of the P-type transistor P12 receives the bias voltage Vbias, its gate receives the voltage level from the first voltage source VDD, and its drain is coupled to the drain of the N-type transistor N12. The gate and drain of the N-type transistor N12 are coupled to each other, and its source is coupled to the node C1. The source of the N-type transistor N13 is coupled to the ground source GND, its gate is coupled to the first voltage source VDD, and its drain is coupled to the node C1. The gate of the P-type transistor P11 functioning as the switch element 401 is coupled to the node C1, its source is coupled to the drain of the P-type transistor P3 of the input buffer 402, and its source is coupled to the drain of the N-type transistor N3 of the input buffer 402 as well as the node A1. When the first voltage source VDD is inactive, the N-type transistor N13 is in an OFF state while the P-type transistor P12 is in an ON state. Meanwhile, the voltage at the node C1 is at a high level so as to control the switch element 401 (i.e. the P-type transistor P11) to switch off, thereby preventing charges at the node A1 from infusing into the input buffer 402. On the other hand, after the first voltage source VDD is activated, the N-type transistor N13 is turned on while the P-type transistor P12 is turned off. Meanwhile, the voltage level at the node C1 is at a zero level so that the output of the input buffer 402 can be normally transmitted to the level adjusting unit 404.

Hereinafter, the operations of the circuitry are described with reference to FIGS. 3~6. First of all, a situation that the second voltage source VPP is activated while the voltage level of the first voltage source VDD is still 0 is considered. Assume the input signal Vin is at a high level. As shown in the waveform diagram of FIG. 4, during the second voltage source VPP is just activated so that the voltage level is rising from 0 to 3.3V, the voltage level at the node A1 is zero as the first voltage source VDD has a zero voltage level. Therefore, the current path from the node B2 to ground GND is cut off. Once the voltage of the second voltage source VPP reaches a level capable of conducting the bias circuit 400, the PMOS P8, P9 and the NMOS N8, N9 in the bias circuit 400 divide the voltage from the second voltage source VPP so as to generate the bias voltage Vbias approximate to the constant voltage of the first voltage source VDD. Furthermore, since the voltage of the first voltage source VDD is 0, the P-type transistor P10 is in an ON state, and the output node A1 of the input buffer 402 is charged to a level substantially equal to Vbias minus VT, where VT is the threshold voltage provided by the N-type transistor N10. As for the node A2, its voltage is pulled to 0 as the voltage at the node A1 turns the N-type transistor N11 on. Consequently, the voltage level of the node A2 is immune from the possible RC couple effect. At the same time, the N-type transistor N13 of the isolation device 49 is also in an OFF state. As a result, the node C1 has the same level as the node A1, the P-type transistor P11 is turned off to guarantee successful charge to (Vbias−VT) at the node A1, and the charges at the node A1 are prevented from infusing into the input buffer 402.

It is understood from the above descriptions, on the condition that the voltage of the first voltage source VDD is 0, the voltage at the node A1 will rise to the preset level (Vbias−VT) with the activation of the second voltage source VPP, with which the N-type transistor N5 of the voltage adjusting unit 404 is switched on, the voltage at the node B1 is driven to 0, and finally the voltage at the node B2 rises to the voltage level of the second voltage source VPP through the conduction of the P-type transistor P4. In other words, the P-type transistor P5 is cut off and the voltage level at the node B1 is kept low so as to keep the voltage level of the output signal Vout low, e.g. a ground level, thereby achieving the object of automatic initialization.

It is to be noted that in this embodiment, the isolation device 49 and the initial voltage generator 408 may be directly biased between the second voltage source VPP and the first voltage source VDD without affecting the operation of the level shifter. In other words, the bias circuit 400 may be omitted. As a matter of fact, as known to those ordinary skilled in the art, the bias circuit 400 principally functions to generate a bias voltage with a lower voltage level in response to a higher voltage level from the second voltage source VPP so as to protect the transistor from the high voltage and elongate the lifespan of the transistor.

Next, a situation that the activation of the second voltage source VPP has completed and the first voltage source VDD is being activated is analyzed. Referring to the waveform diagram of FIG. 5, respective waveforms of plural nodes are shown on the conditions that the voltage level of the second voltage source VPP is 3.3V and the voltage level of the first voltage source VDD is rising from 0 to 1.2V. Similar to the above-described situation, it is assumed that the input voltage Vin is at a high level. Since the bias voltage Vbias is at a constant level approximate to the voltage level of the first voltage source VDD, the initial voltage generator 408 charges the node A1 to a voltage level of (Vbias−VT) before the voltage of the first voltage source VDD increases to a level capable of turning off the P-type transistor P10 of the initial voltage generator 408 and driving the N-type transistor N13 of the isolation device 49. Meanwhile, the voltage of the node C1 is also raised to the level of (Vbias−VT) due to the effects of the P-type transistor P12 and the N-type transistor N12. After the voltage of the first voltage source VDD increases to a level capable of controlling the input buffer 402, the P-type transistors P10 and P12 will be turned off and the N-type transistor N13 will be conducted. Meanwhile, a current path for providing the bias voltage Vbias to the node A1 is cut off, and the voltage of the node C1 is pulled down to 0 due to the conduction of the transistor N10, thereby conducting the P-type transistor P11. In this way, the automatic initialization circuit including the isolation device 49 and the initial voltage generator 408 are disabled from affecting the voltage level of the node A1. Furthermore, since the P-type transistor will not have VT loss while transmitting a high level voltage, the P-type transistor P11 has no effect on the output voltage level from the node A1.

Figure 6:
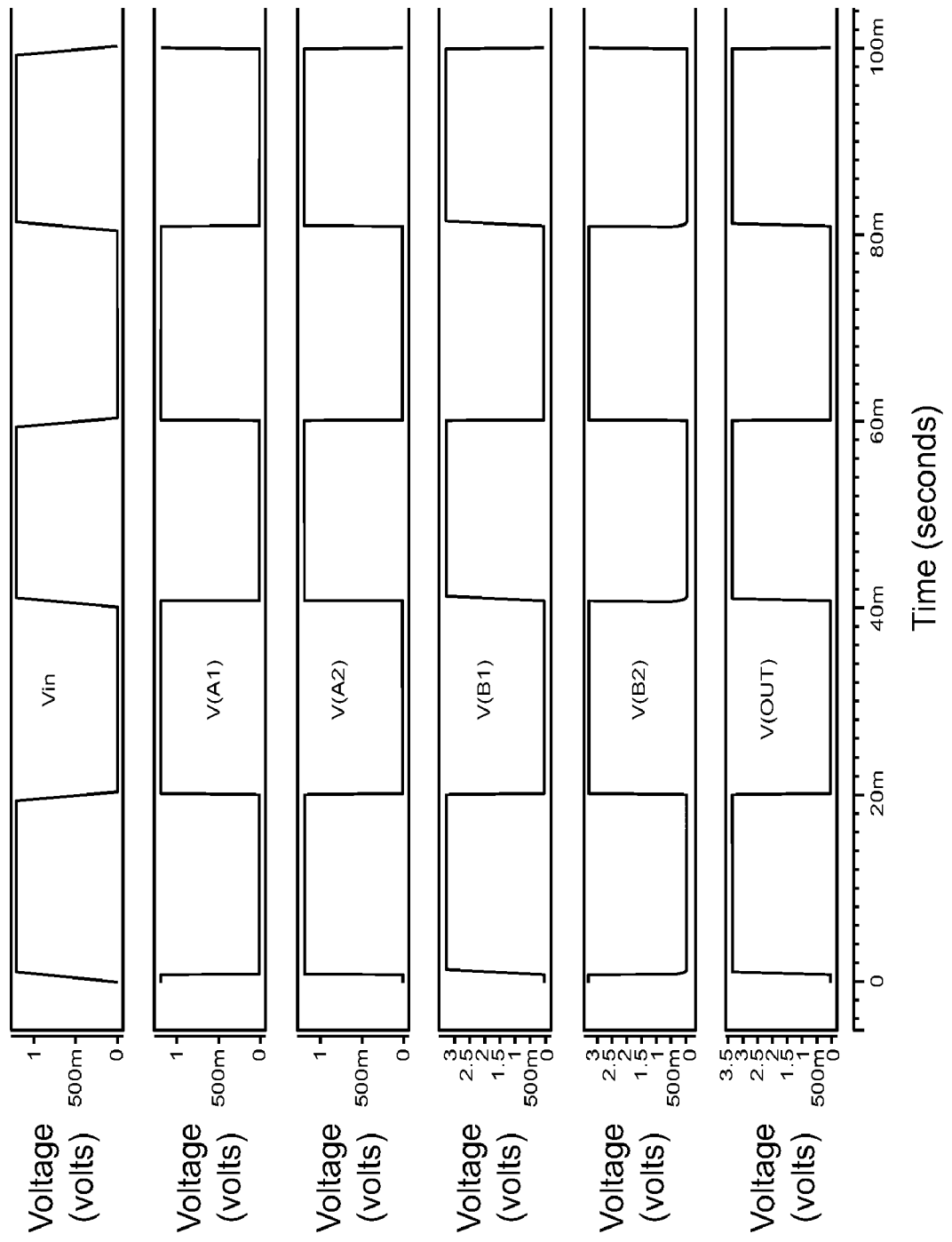
FIG. 6 is a voltage vs. current plot at a variety of nodes when a level shifter according to an embodiment of the present invention works normally.

Referring to FIG. 6, the waveform diagram including plural nodes shown in FIG. 3 is realized on the conditions that the voltage level of the first voltage source VDD is 1.2V and the voltage level of the second voltage source VPP is 3.3V. If the input signal Vin is at a high level, the node A2 is also at a high level (equal to the voltage level of the first voltage source VDD) so that the P-type transistor P3 is turned off, the N-type transistor N3 is turned on, and the node A1 is at a low level. Meanwhile, the N-type transistor N4 is turned on, the N-type transistor N5 is turned off, thus the P-type transistor P5 is turned on, the P-type transistor P4 is turned off, and the node B1 is at a high level (equal to the voltage level of the second voltage source VPP). The output buffer 406 outputs an output signal Vout with a high level according to the voltage level of the node B1 so as to accomplish the level shift from the voltage level of the first voltage source VDD to the voltage level of the second voltage source VPP.

On the other hand, if the input signal Vin is at a low level, the node A2 is also at a low level (equal to the voltage level of the ground source GND) so that the P-type transistor P3 is turned on, the N-type transistor N3 is turned off, and the node A1 is at a high level (equal to the voltage level of the first voltage source VDD). Meanwhile, the N-type transistor N5 is turned on, the N-type transistor N4 is turned off, thus the P-type transistor P4 is turned on, the P-type transistor P5 is turned off, and the node B1 is at a low level. The output buffer 406 outputs an output signal Vout with a low level according to the voltage level of the node B1. Therefore, the level shifter according to the present invention can work within a relatively large voltage range, while keeping the balance of the circuitry, i.e. keeping the toggling states of the voltage signals at the input end, the nodes A1, A2, B1 and B2, and the output end substantially consistent, as shown in FIG. 6.

To sum up, according to the present invention, a relatively low price is paid to obtain a relatively large voltage range and an automatic initialization function of a level shifter. Furthermore, if necessary, the above-described bias circuit can be used to provide bias voltages for a plurality of level shifters provided that the dynamic response balance is not affected.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter for converting an input signal into an output signal, comprising:
   an input buffer coupled between a first voltage source and a ground source for receiving the input signal;
   an output buffer coupled to a second voltage source and the ground source for outputting the output signal;
   a level adjusting unit electrically coupled between the input buffer and the output buffer and coupled to the ground source and the second voltage source for shifting a voltage level of the input signal from the input buffer according to a voltage level of the second voltage source;
   an initial voltage generator electrically coupled to the level adjusting unit and coupled to the first voltage source and the second voltage source, the initial voltage generator being configured to provide an initial voltage for the level adjusting unit in response to activation of the second voltage source and non-activation of the first voltage source; and
   an isolation device electrically coupled to the input buffer and coupled to the first voltage source and the second voltage source, the isolation device being configured to block charges from the second voltage source from infusing into the input buffer in response to activation of the second voltage source and non-activation of the first voltage source; wherein the isolation device includes:
      a control voltage generator for generating a control voltage based on voltages originating from the second voltage source; and
      a switch element disposed between the second voltage source and the input buffer for optionally cutting off the electric connection between the second voltage source and the input buffer according to the control voltage; and
   wherein the control voltage generator includes:
      a first P-type transistor having a source and a gate thereof coupled to the second voltage source and the first voltage source, respectively;
      a first N-type transistor having a drain and a gate thereof coupled to the drain of the first P-type transistor, and a source thereof coupled to the control voltage; and
      a second N-type transistor having a source thereof coupled to the ground source, and a drain and a gate thereof respectively coupled to the source and of the first N-type transistor and the first voltage source.

2. The level shifter according to claim 1 wherein the level adjusting unit is coupled to the second voltage source via the initial voltage generator and a bias circuit.

3. The level shifter according to claim 1 wherein the switch element is a P-type transistor having a gate and a drain thereof respectively coupled to the control voltage and an electric path between the first voltage source and the level adjusting unit, and the switch element cuts off the electric path to electrically disconnect the input buffer from the second voltage source in the event that the second voltage source is activated and the first voltage source has not been activated yet.

4. The level shifter according to claim 1 wherein the isolation device is coupled to the second voltage source via a bias circuit, and the voltage originating from the second voltage source is a bias voltage outputted by the bias circuit.

5. The level shifter according to claim 1 wherein the initial voltage generator includes:
   a switch element coupled to the first voltage source and the second voltage source, the switch element being conducted to pass therethrough the voltage originating from the second voltage source in the event that the second voltage source is activated and the first voltage source has not been activated yet, and cut off once the first voltage source is activated; and
   a voltage drop element coupled to the switch element for receiving and dropping the voltage passing through the switch element to obtain the initial voltage.

6. The level shifter according to claim 5 wherein the switch element is a transistor switch and having a source thereof coupled to the second voltage source, a gate thereof coupled to the first voltage source and a drain thereof coupled to the voltage drop element.

7. The level shifter according to claim 5 wherein the voltage drop element is an N-type transistor having a drain and a gate thereof coupled to an output end of the switch element and a source thereof coupled to the level adjusting unit.

8. The level shifter according to claim 5 wherein the initial voltage generator is coupled to the second voltage source via a bias circuit, and the voltage originating from the second voltage source is a bias voltage outputted by the bias circuit.

9. A level shifter, comprising:
an input buffer coupled between a first voltage source and a ground source for receiving an input signal;
an output buffer coupled to a second voltage source having a voltage level higher than that of the first voltage source and the ground source for outputting an output signal;
a level adjusting unit electrically coupled between the input buffer and the output buffer and coupled to the ground source and the second voltage source for shifting a voltage level of the input signal from the input buffer according to a voltage level of the second voltage source;
an initial voltage generator electrically coupled to the level adjusting unit and coupled to the first voltage source and the second voltage source, the initial voltage generator being configured to provide an initial voltage for the level adjusting unit in response to activation of the second voltage source and non-activation of the first voltage source; and
an isolation device electrically coupled to the input buffer and coupled to the first voltage source and the second voltage source, the isolation device being configured to block charges from the second voltage source from infusing into the input buffer in response to activation of the second voltage source and non-activation of the first voltage source, and including:
a first P-type transistor having a source and a gate thereof coupled to the second voltage source and the first voltage source, respectively;
a first N-type transistor having a drain and a gate thereof coupled to the drain of the first P-type transistor, and a source thereof coupled to a control voltage; and
a second N-type transistor having a source thereof coupled to the ground source, and a drain and a gate thereof respectively coupled to the source of the first N-type transistor and the first voltage source.

10. The level shifter according to claim 9, further comprising a bias circuit coupled to the second voltage source for generating a bias voltage, which is supplied to the initial voltage generator and the isolation device, wherein the bias voltage approximates to a voltage level of the first voltage source.

11. A level shifting method, comprising:
converting an input signal in respect of a first voltage source into an output signal in respect of a second voltage source in response to an initial voltage derived from a second voltage source in the event that the second voltage source is activated and the first voltage source has not been activated yet;
shifting the input signal in respect of the first voltage source into the output signal in respect of the second voltage source without cooperation of the initial voltage in response to the voltages of the first voltage source and the second voltage source which are both activated; and
generating a control voltage by a control voltage generator based on voltages originating from the second voltage source, wherein the control voltage generator includes:
a first P-type transistor having a source and a gate thereof coupled to the second voltage source and the first voltage source, respectively;
a first N-type transistor having a drain and a gate thereof coupled to the drain of the first P-type transistor, and a source thereof coupled to a control voltage; and
a second N-type transistor having a source thereof coupled to the ground source, and a drain and a gate thereof respectively coupled to the source of the first N-type transistor and the first voltage source, and
wherein the control voltage is generated for isolating an input buffer for providing the input signal in respect of the first voltage source from the second voltage source in response to activation of the second voltage source and non-activation of the first voltage source.

12. The method according to claim 11 further comprising:
conducting a switch element for electrically connecting the input buffer with the second voltage source in response to activation of both the first voltage source and the second voltage source.

13. The method according to claim 11 wherein the initial voltage and the control voltage are generated by dropping the voltage of the second voltage source.

14. The method according to claim 13 wherein a level of the control voltage has substantially the same level as the initial voltage.

15. The method according to claim 11 wherein the control signal and the initial voltage are generated in response to a bias voltage obtained by dropping the voltage of the second voltage source.

16. The method according to claim 15 wherein a level of the bias voltage approximates to the voltage level of the first voltage source.

17. The method according to claim 12 wherein the switch element is a P-type transistor.

* * * * *